(12) United States Patent
Naya

(10) Patent No.: US 7,279,792 B2
(45) Date of Patent: Oct. 9, 2007

(54) SEMICONDUCTOR DEVICE AND METHOD OF MANUFACTURING SAME

(75) Inventor: Kinichi Naya, Ome (JP)

(73) Assignee: Casio Micronics Co., Ltd, Tokyo (JP)

( * ) Notice: Subject to any disclaimer, the term of this patent is extended or adjusted under 35 U.S.C. 154(b) by 0 days.

(21) Appl. No.: 10/842,412

(22) Filed: May 10, 2004

(65) Prior Publication Data
   US 2005/0167800 A1    Aug. 4, 2005

(30) Foreign Application Priority Data
   Jan. 19, 2004    (JP)    ............................ 2004-010688

(51) Int. Cl.
   *H01L 23/52*    (2006.01)
   *H01L 23/48*    (2006.01)
(52) U.S. Cl. ............... 257/758; 257/739; 257/E23.114; 438/608; 438/609
(58) Field of Classification Search ........ 257/736–737, 257/739, 749, 750, E23.114, 738, 758; 438/608, 438/609
   See application file for complete search history.

(56) References Cited

U.S. PATENT DOCUMENTS

| | | | |
|---|---|---|---|
| 4,522,656 A | 6/1985 | Kuhn-Kuhnenfeld et al. .... | 148/1.5 |
| 6,218,199 B1 | 4/2001 | Sato ............................ | 438/14 |
| 2001/0004133 A1* | 6/2001 | Ihara .......................... | 257/750 |

FOREIGN PATENT DOCUMENTS

| | | |
|---|---|---|
| JP | 60-377-16 | 2/1985 |
| JP | 4-106960 | 4/1992 |
| JP | 8-191038 | 7/1996 |
| JP | 10-106905 | 4/1998 |
| JP | 11-214299 | 8/1999 |
| JP | 2000-114129 | 4/2000 |
| JP | 2001-68390 | 3/2001 |
| JP | 2001-85285 | 3/2001 |
| JP | 2003-318335 | 11/2003 |

OTHER PUBLICATIONS

Korean Office Action issued Dec. 20, 2005 in connection with Korean Application No. 10-2004-0033835.
English Translation of Korean Office Action issued Dec. 20, 2005 in connection with Korean Application No. 10-2004-003835.

(Continued)

*Primary Examiner*—Kenneth Parker
*Assistant Examiner*—Joseph Nguyen
(74) *Attorney, Agent, or Firm*—Ohlandt, Greeley, Ruggiero & Perle

(57) ABSTRACT

According to this invention, a semiconductor device has an upper surface on which an external connection electrode is formed and a lower surface which opposes the upper surface and is in a mirror surface state. A roughened region roughened by laser marking is formed at part of the lower surface. The roughened region includes a product information mark of the semiconductor device itself. The product information mark is printed by laser marking. The number, size, shape, and layout position of the roughened regions are decided to make it possible to, when the lower surface is irradiated with light, read the product information from the difference in light reflectance between the roughened region and mirror-finished region.

6 Claims, 14 Drawing Sheets

OTHER PUBLICATIONS

Japanese Office Action issued Mar. 7, 2006 in connection with Japanese Application No. 2004-010688.
English Translation of Japanese Office Action issued Mar. 7, 2006 in connection with Japanese Application No. 2004-010688.
Chinese Office Action dated Mar. 17, 2006 in regards to corresponding Chinese Patent Application No. 200410044719.1 with English translation.
Chinese Office Action dated Sep. 8, 2006 issued in regards to corresponding Chinese Patent Application No. 200410044719.1 (w/English translation).
Japanese Office Action dated Aug. 22, 2006 in regards to corresponding Japanese Patent Application No. 2004-010688 with English translation.

* cited by examiner

SEMICONDUCTOR DEVICE AND METHOD OF MANUFACTURING SAME

CROSS-REFERENCE TO RELATED APPLICATIONS

This application is based upon and claims the benefit of priority from prior Japanese Patent Application No. 2004-010688, filed Jan. 19, 2004, the entire contents of which are incorporated herein by reference.

BACKGROUND OF THE INVENTION

1. Field of the Invention

The present invention relates to a semiconductor device having a component such as an interconnection pattern mounted on a substrate and a method of manufacturing the same and, more particularly, to a semiconductor device having a lower surface on which pieces of product information including the model name and lot number of the device itself are printed, and a method of manufacturing the same.

2. Description of the Related Art

In packaging a semiconductor device made of Si or GaAs, flip chip connection by direct face down is used to make the device compact and lightweight. The packaged semiconductor device always undergoes a test step. For this purpose, pieces of product information including the model name and lot number of the device itself, and an index mark, test mark, and the like are printed on the lower surface of the device by ink or laser marking, as described in, e.g., Jpn. Pat. Appln. KOKAI Publication Nos. 2000-114129, 2001-85285, 8-191038, and 4-106960.

On the other hand, since such a semiconductor device aims at decreasing the thickness, its lower surface is normally mirror-finished by a grinder. Since the lower surface is glossier than the product information and marks, the semiconductor device is not suitable for automatic testing by an optical test apparatus for the product information and marks. As a measure against this, an ink application portion with a lower light reflectance than that of the substrate is formed, as described in, e.g., Jpn. Pat. Appln. KOKAI Publication No. 2003-318335. Alternatively, the lower surface, which is mirror-finished and has product information and marks, is wholly subjected to surface roughening on purpose. With this process, contrast is suppressed in accordance with the product information and marks. Accordingly, the product information of the semiconductor device can be read or the mark position can be recognized by using an optical test apparatus.

Examples of surface roughening are sand blasting, lapping using abrasive grain, and etching using hydrofluoric-acid-based mixed acid. With such surface roughening, the lower surface of the semiconductor device is physically or chemically nonuniformly ground. This suppresses the gloss on the entire lower surface and allows automatic testing by an optical test apparatus.

Conventionally, the lower surface of a semiconductor device is temporarily mirror-finished. After that, a product information mark and index and test marks are formed on it. Then, the lower surface is roughened.

However, when surface roughening is performed, marks printed by ink become partially invisible. For marks formed by laser marking, their three-dimensional patterns are partially shaved. For this reason, the mark recognition accuracy in automatic testing by an optical test apparatus may be low.

To avoid this, the marks may be formed again after surface roughening. However, when marks are printed by ink on the roughened surface, the ink blots, and the marks blur. It therefore provides no practical solution. Even laser marking can form no stable pattern on the roughened surface because of its three-dimensional pattern. It provides no practical solution, either. When sand blasting or etching using mixed acid is applied, only a necessary portion can be roughened. However, these methods are disadvantageous because they require many additional steps such as photolithography, cleaning, and rinsing.

As shown in FIGS. 1 to 5, a semiconductor device 18 includes a silicon substrate 60, sealing resin 28, and a plurality of external connection terminals 36. When the semiconductor device is to be split along split lines 25 and separated into semiconductor devices 16, a dicing tape 20 bonded to a dicing jig 62 in advance is bonded to the lower surface, as shown in FIG. 1. The general dicing tape 20 is formed from an adhesive and a base film member. As the adhesive, acrylic resin is used. As the base film material, vinyl chloride resin is used.

To separate the semiconductor devices 16 from the semiconductor device 18, the semiconductor device 18 is cut by a dedicated dicing blade 17 along the split lines 25, as shown in FIG. 2. Then, the semiconductor devices are placed on an expander constituted by a stage 66 incorporating a heater 64, and a ring 68, as shown in FIG. 3. The dicing tape 20 is heated by the heater 64. After that, the stage 66 and ring 68 are pushed upward in FIG. 3 by a known elevator mechanism while the dicing jig 62 is fixed not to move. As shown in FIG. 3, the distance between the semiconductor devices 16 adjacent to each other increases as the dicing tape 20 stretches so that the semiconductor devices 16 are separated from each other. As shown in FIG. 4, the dicing tape 20 is cut between the ring 68 and the dicing jig 62 and detached from the stage 66. The dicing tape 20 is irradiated with UV rays 70 from its lower surface side. The adhesive force of the acrylic resin used as the adhesive of the dicing tape 20 is weakened by this irradiation of UV rays. After the adhesive force is weakened, the dicing tape 20 is removed from the lower surface of each semiconductor device 16, as shown in FIG. 5.

In this case, if the three-dimensional pattern formed for a mark is sufficiently small, the dicing tape 20 can easily be removed from the lower surface. When the three-dimensional pattern is large to some extent, the dicing tape 20 may weld along the three-dimensional pattern and be difficult to remove.

BRIEF SUMMARY OF THE INVENTION

The present invention has been made in consideration of the above situation, and has as its first object to provide a semiconductor device which makes it possible to accurately recognize, by image processing, a mark of product information or the like formed on the lower surface even when it is mirror-finished, and accordingly, execute automatic testing by an optical test apparatus, and a method of manufacturing the same.

It is the second object of the present invention to provide a semiconductor device which makes it possible to easily remove a dicing tape bonded to the lower surface, and a method of manufacturing the same.

In order to achieve the above object, the present invention takes the following means.

According to a first aspect of the present invention, there is provided a semiconductor device which has a first surface on which an external connection electrode is formed and a second surface which opposes the first surface and is in a mirror surface state, a roughened region roughened by laser marking being formed at part of the second surface. The roughened region contains product information of the semiconductor device itself, which is input by laser marking.

According to a second aspect of the present invention, in the semiconductor device of the first aspect, the roughened region is formed from a plurality of craters each including a recessed portion and a projecting portion around the recessed portion. A difference between a bottom portion of the recessed portion and a top portion of the projecting portion is 1 to 10 µm.

According to a third aspect of the present invention, in the semiconductor device of the first or second aspect, the roughened region includes the plurality of craters each including the recessed portion and the projecting portion around the recessed portion. Adjacent craters do not overlap.

According to a fourth aspect of the present invention, in the semiconductor device of the first or second aspect, the roughened region includes the plurality of craters each including the recessed portion and the projecting portion around the recessed portion. A separation distance along the second surface between adjacent craters is not more than a maximum width of the crater along the second surface.

According to a fifth aspect of the present invention, in the semiconductor device of any one of the first to fourth aspects, the number, size, shape, and layout position of the roughened regions are decided to make it possible to, when the second surface is irradiated with light, read the product information from a difference in light reflectance between the roughened region and a region other than the roughened region.

According to a sixth aspect of the present invention, in the semiconductor device of any one of the first to fifth aspects, the roughened region includes an index mark of the semiconductor device itself, which is formed by laser marking.

According to a seventh aspect of the present invention, after a semiconductor device cluster including a plurality of semiconductor devices of any one of the first to sixth aspects is prepared, the semiconductor device cluster is split into a predetermined size to manufacture the semiconductor device.

Hence, in the present invention, by taking the means of the first to seventh aspects the contrast of the lower surface can be reduced by the roughened region including the marks of product information and the like. Accordingly, when the lower surface is irradiated with light, the product information and the like can be read from the difference in light reflectance between the roughened region and an unroughened region. Hence, efficient automatic test by an optical test apparatus can be executed.

Especially when the means of the second to fourth aspects are taken, a dicing tape bonded to the lower surface can also easily be removed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
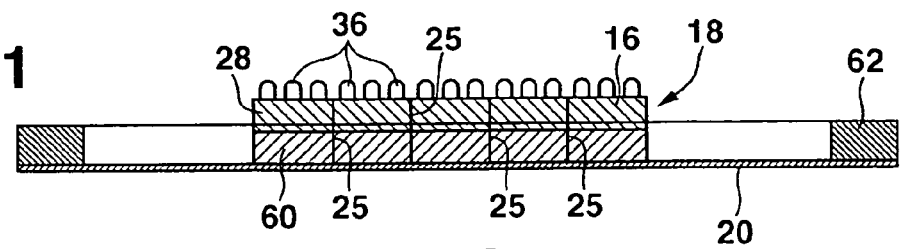
FIG. 1 is a view showing part of a general wafer dicing process (dicing tape bonding)
Figure 2:
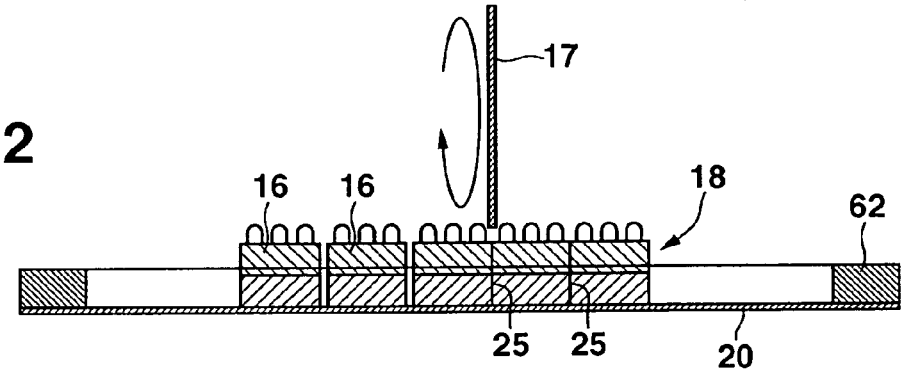
FIG. 2 is a view showing part of the general wafer dicing process (dicing of a semiconductor wafer)
Figure 3:
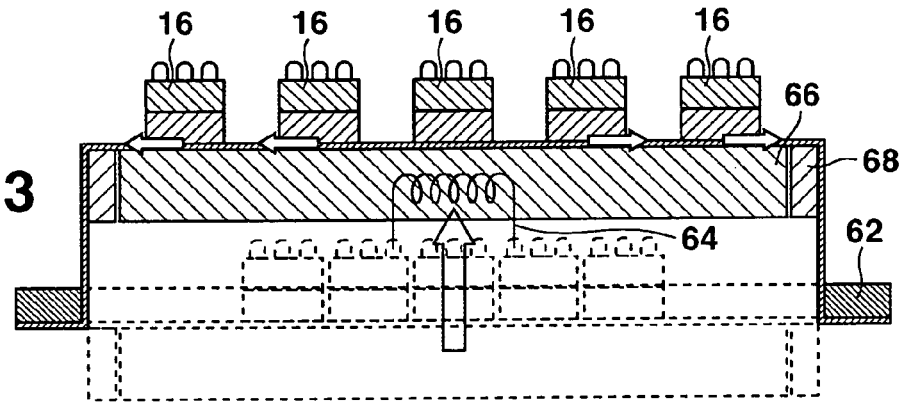
FIG. 3 is a view showing part of the general wafer dicing process (expand)
Figure 4:
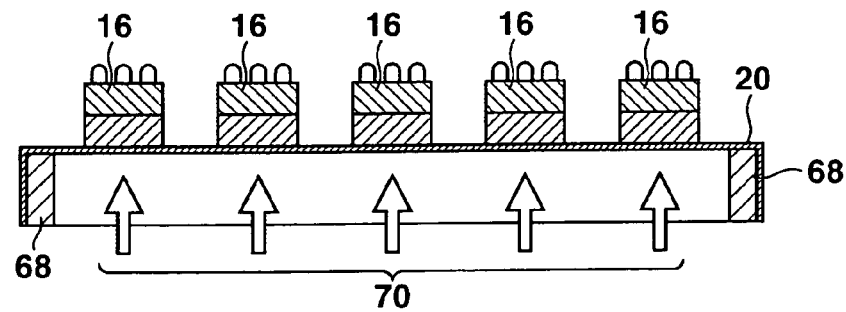
FIG. 4 is a view showing part of the general wafer dicing process (UV irradiation)
Figure 5:
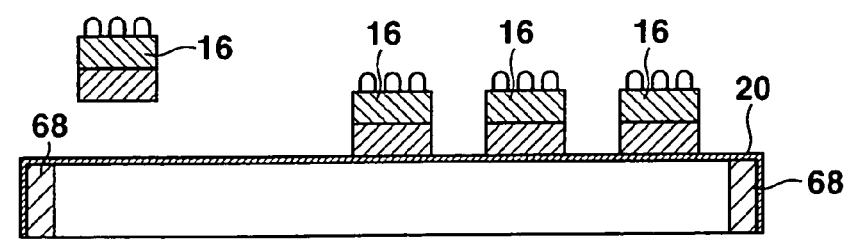
FIG. 5 is a view showing part of the general wafer dicing process (pickup of each semiconductor device)

The best mode for carrying out the present invention will be described below with reference to the accompanying drawing.

The same reference numerals as in FIGS. 1 to 5 denote the same parts throughout the drawing.

FIRST EMBODIMENT

Figure 6:
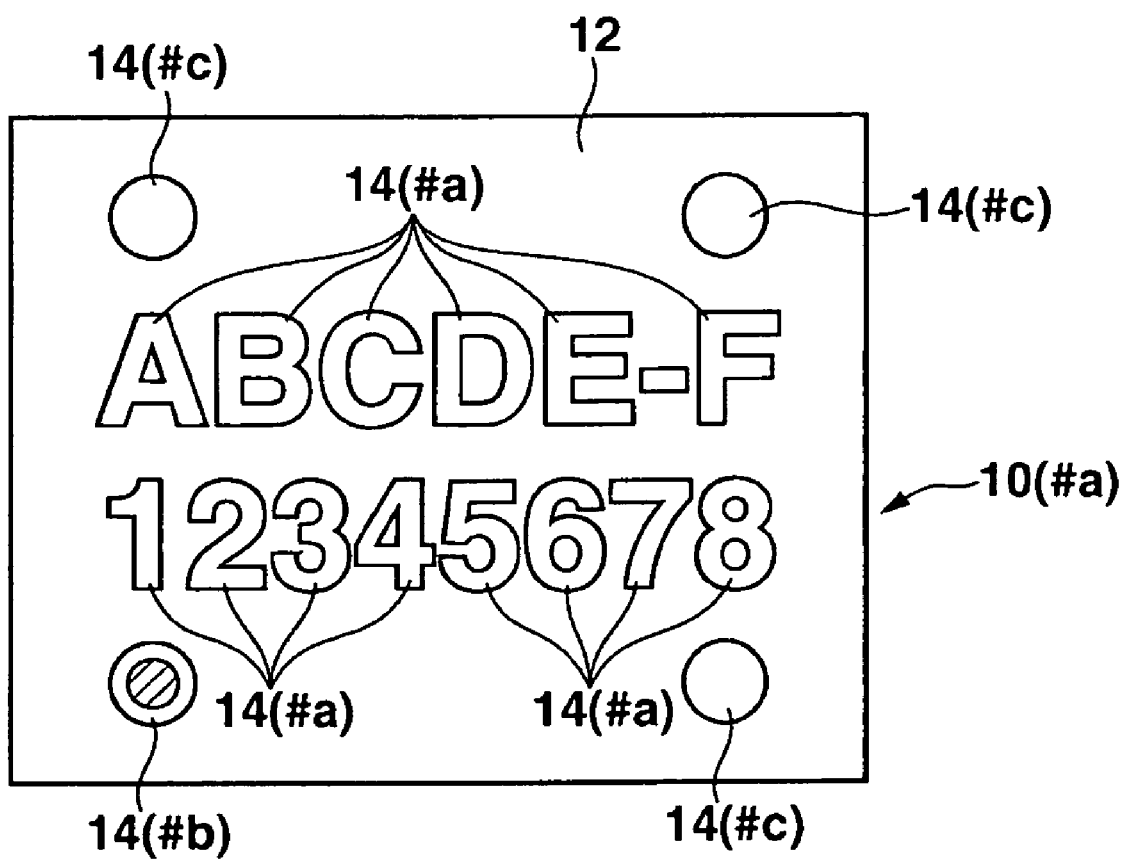
FIG. 6 is a plan view showing an example of the lower surface of a semiconductor device according to the first embodiment.

FIG. 6 is a plan view showing an example of the lower surface of a semiconductor device according to the first embodiment of the present invention.

A lower surface 10 (#a) of the semiconductor device according to this embodiment is mirror-finished by a grinder or the like. After that, a roughened region 14 roughened by laser marking is formed on part of the lower surface. A region except the roughened region 14 is a mirror-finished region 12.

A product information mark 14 (#a) of the semiconductor device, an index or test mark 14 (#b), and a contrast adjusting mark 14 (#c) are formed in the roughened region 14.

A method of manufacturing the semiconductor device according to this embodiment will be described next.

Figure 7:
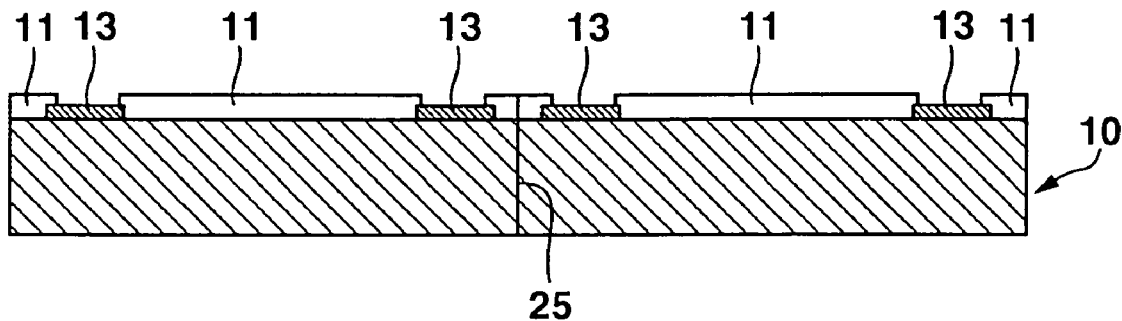
FIG. 7 is a longitudinal sectional view showing an example of the semiconductor device according to the first embodiment in a step of the method of manufacturing the semiconductor device (wafer preparation)

First, as shown in FIG. 7, semiconductor elements are formed in active areas (not shown) of a semiconductor wafer 10 made of silicon or GaAs by a normal method. Electrode pads 13 connected to the devices in the active areas are formed by a known method. The entire surface of the wafer, except the surfaces of the electrode pads 13, is covered with a vitreous protective film 11 made of PSG, NSG; or a combination thereof. That is, the wafer 10 with only the electrode pads 13 exposed to the upper surface is prepared. Reference numeral 25 denotes a split line. The wafer 10 is finally cut along the split line 25 to pick up each semiconductor device 16.

Figure 8:
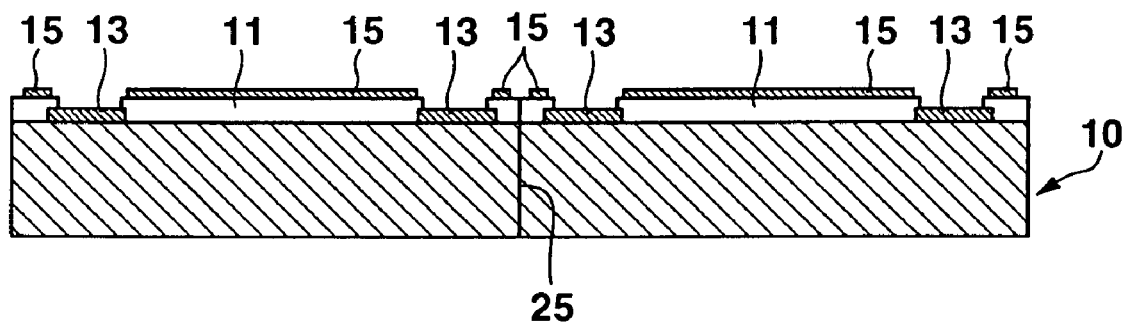
FIG. 8 is a longitudinal sectional view showing an example of the semiconductor device according to the first embodiment in a step of the method of manufacturing the semiconductor device (polyimide patterning)

As shown in FIG. 8, polyamic acid as a photo-sensitive precursor is applied to a thickness of about 10 µm by using a coating method such as spin coating. Prebaking is performed to heat and dehydrate the polyamic acid and solidify it. The thickness of a resultant polyimide layer 15 is about 5 µm. The resultant structure is exposed and developed by using a predetermined glass mask under predetermined conditions, thereby patterning the polyimide. The polyimide is post-cured again to increase the imidization ratio to 90% or more, thereby forming the ultimate polyimide layer 15.

Figure 9:
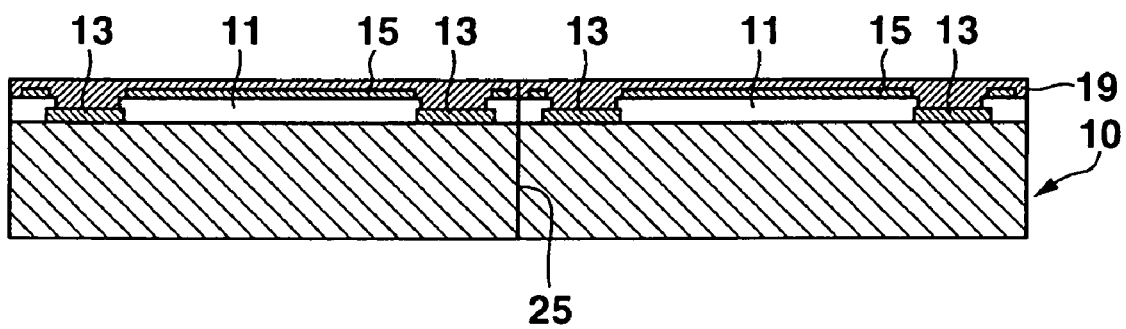
FIG. 9 is a longitudinal sectional view showing an example of the semiconductor device according to the first embodiment in a step of the method of manufacturing the semiconductor device (UBM formation)

As shown in FIG. 9, a UBM 19 is formed on the entire surface of the polyimide layer 15. To form the UBM 19, for example, a Ti layer having a thickness of 1,000 to 2,500 Å (1 Å is $10^{-8}$ cm) is formed next by a preprocess by using sputtering as a conventional method. Subsequently, a Cu layer having a thickness of about 4,500 to 7,500 Å is formed.

Figure 10:
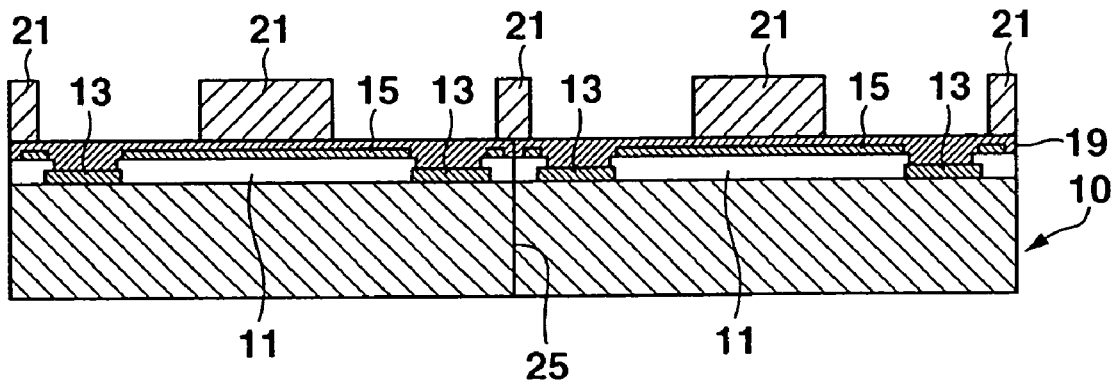
FIG. 10 is a longitudinal sectional view showing an example of the semiconductor device according to the first embodiment in a step of the method of manufacturing the semiconductor device (resist patterning)

As shown in FIG. 10, a liquid of a photosensitive plating resist 21 is applied by a coating method such as spin coating. Prebaking is performed. The resultant structure is exposed and developed by using a predetermined glass mask to pattern the plating resist 21.

Figure 11:
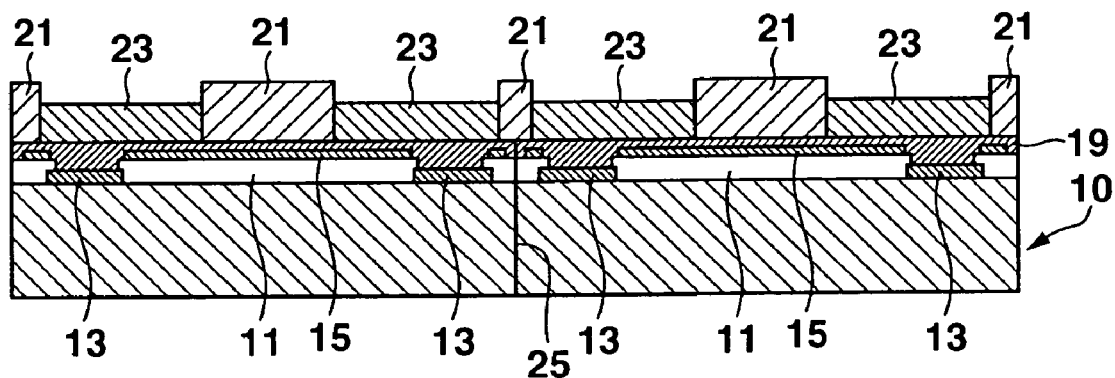
FIG. 11 is a longitudinal sectional view showing an example of the semiconductor device according to the first embodiment in a step of the method of manufacturing the semiconductor device (redistribution)

As shown in FIG. 11, a redistribution layer 23 is formed by using a conductive material such as Ni, Cu, or Ag and the UBM 19 as a cathode. In this case, when jet or rack electrolytic plating is executed by using, e.g., Cu, the thickness is about 5.0 µm.

Figure 12:
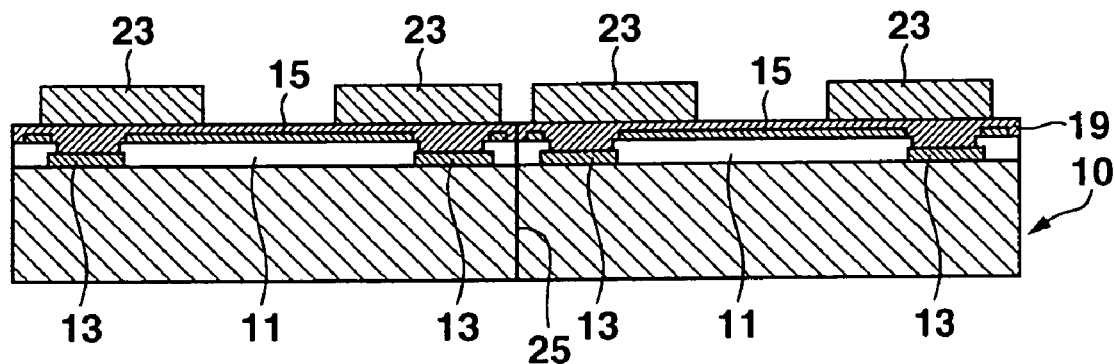
FIG. 12 is a longitudinal sectional view showing an example of the semiconductor device according to the first embodiment in a step of the method of manufacturing the semiconductor device (resist removal)

As shown in FIG. 12, the plating resist 21 is removed by using an alkaline release agent.

Figure 13:
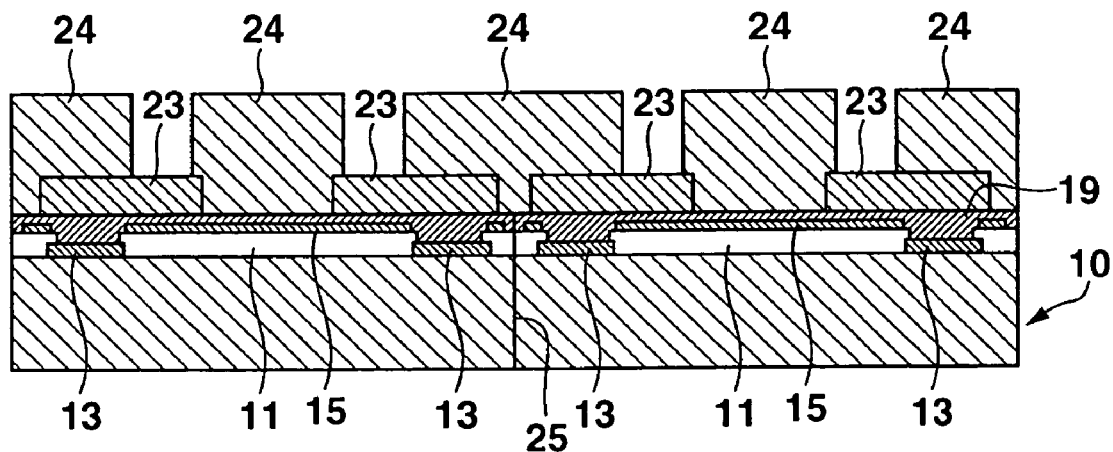
FIG. 13 is a longitudinal sectional view showing an example of the semiconductor device according to the first embodiment in a step of the method of manufacturing the semiconductor device (dry film resist patterning and the like)

As shown in FIG. 13, a photosensitive dry film resist 24 having a thickness of about 100 µm is laminated, by laminating in vacuum or under the atmospheric pressure, on the surface of the wafer 10 having the redistribution layer 23. The resultant structure is exposed and developed by using a predetermined glass mask to pattern the dry film resist 24 such that openings are formed on the redistribution layer 23 at portions where post electrodes should be formed.

Figure 14:
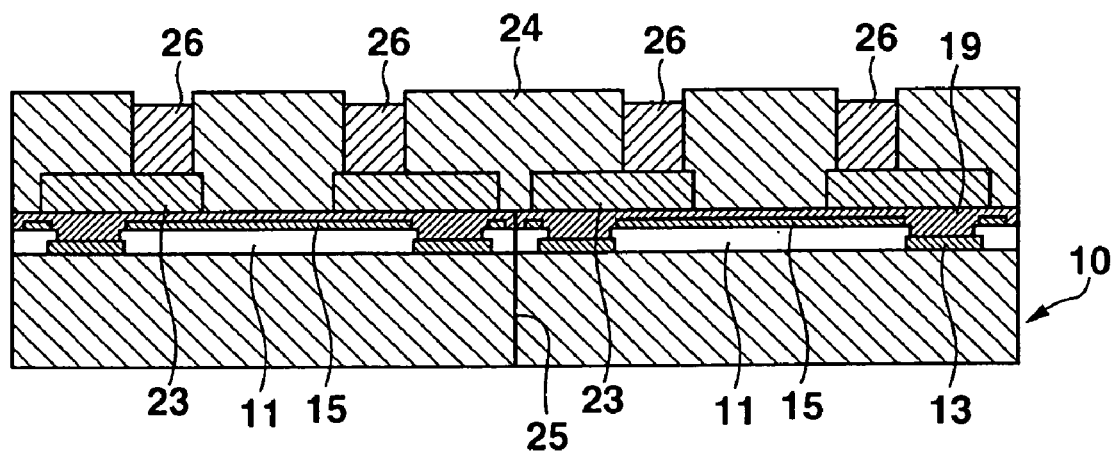
FIG. 14 is a longitudinal sectional view showing an example of the semiconductor device according to the first embodiment in a step of the method of manufacturing the semiconductor device (post electrode formation)

As shown in FIG. 14, post electrodes 26 are formed by electrolytic plating using, e.g., Cu and the UBM 19 as a common cathode electrode. The thickness of the post electrode 26 is about 70 to 90 µm.

Figure 15:
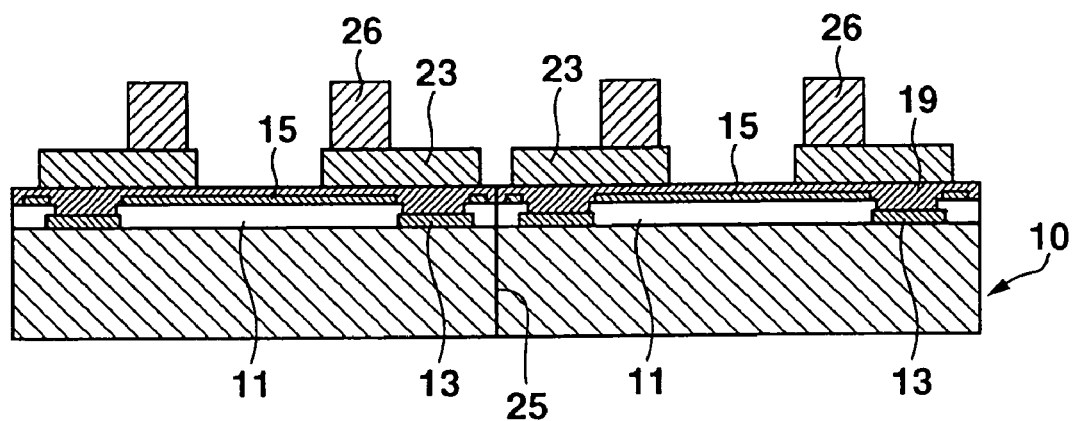
FIG. 15 is a longitudinal sectional view showing an example of the semiconductor device according to the first embodiment in a step of the method of manufacturing the semiconductor device (dry film resist removal)
Figure 16:
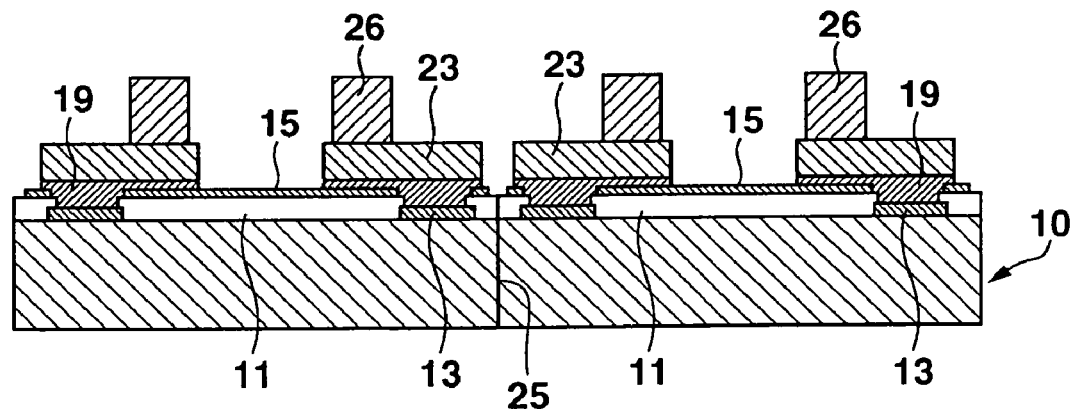
FIG. 16 is a longitudinal sectional view showing an example of the semiconductor device according to the first embodiment in a step of the method of manufacturing the semiconductor device (UBM etching)

As shown in FIG. 15, the dry film resist 24 is removed by using an alkaline dry film resist release agent to expose the UBM 19. As shown in FIG. 16, the exposed UBM 19 is wholly removed from the surface layer, i.e., the Cu layer by using a (sulfuric acid+hydrogen peroxide) solution- or alkaline-based Cu etchant at a temperature of about 30° C. and by using the redistribution layer 23 as a mask. When the Cu layer removal is ended, cleaning and drying are performed. The exposed Ti layer is etched. The etchant used is a Ti etchant such as a hydrogen peroxide at a liquid temperature of about 50° C. to 65° C. The Ti layer is dipped into the etchant and removed. When the removal is ended, the resultant structure is cleaned by DIW and dried.

Figure 17:
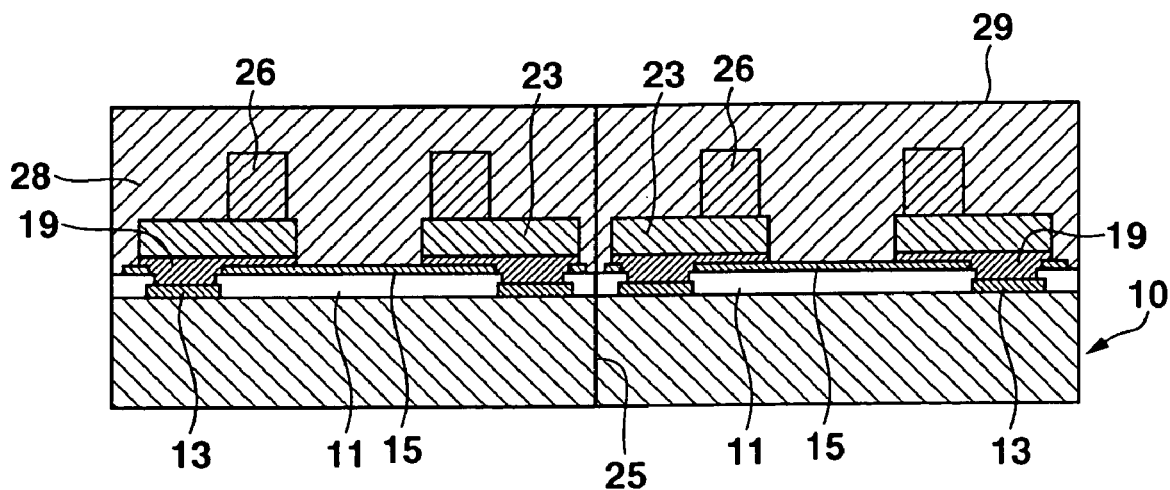
FIG. 17 is a longitudinal sectional view showing an example of the semiconductor device according to the first embodiment in a step of the method of manufacturing the semiconductor device (sealing resin layer formation)

As shown in FIG. 17, a sealing resin 28 made of, e.g., an epoxy resin liquid is applied to entirely cover the wafer 10 by a sealing method such as transfer molding or printing such that the post electrodes 26 are completely buried. The sealing resin 28 is heated to about 120° C. to 150° C. in an inert atmosphere or atmosphere for about 60 min by using an oven or furnace (not shown) and set.

Figure 18:
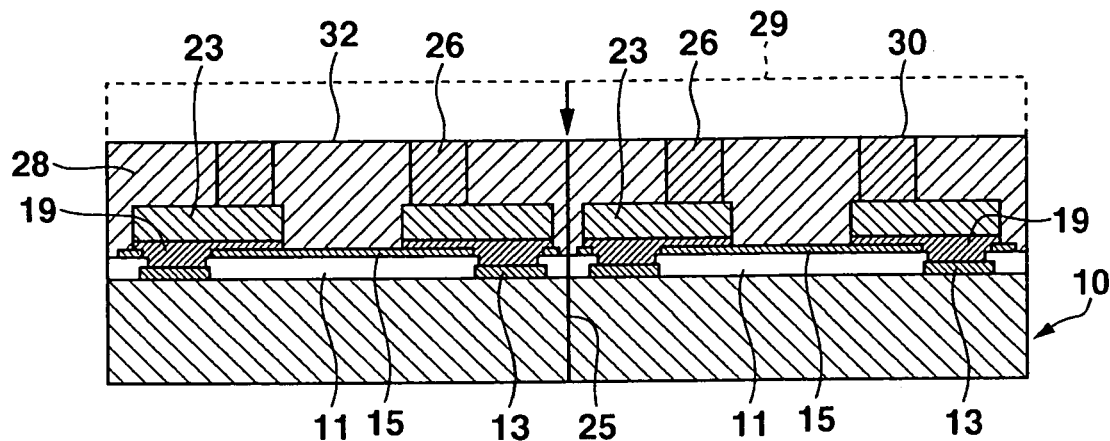
FIG. 18 is a longitudinal sectional view showing an example of the semiconductor device according to the first embodiment in a step of the method of manufacturing the semiconductor device (surface polishing)

As shown in FIG. 18, the upper surface side of the wafer 10 is polished by CMP (Chemical Mechanical Polishing) to expose the surfaces of the post electrodes 26 buried in the sealing resin 28. Accordingly, a sealing resin surface 29 is planarized, and simultaneously, top portion surfaces 30 of the post electrodes 26 are exposed. At this time, the thickness of the sealing resin 28 is 80 to 90 µm.

Figure 19:
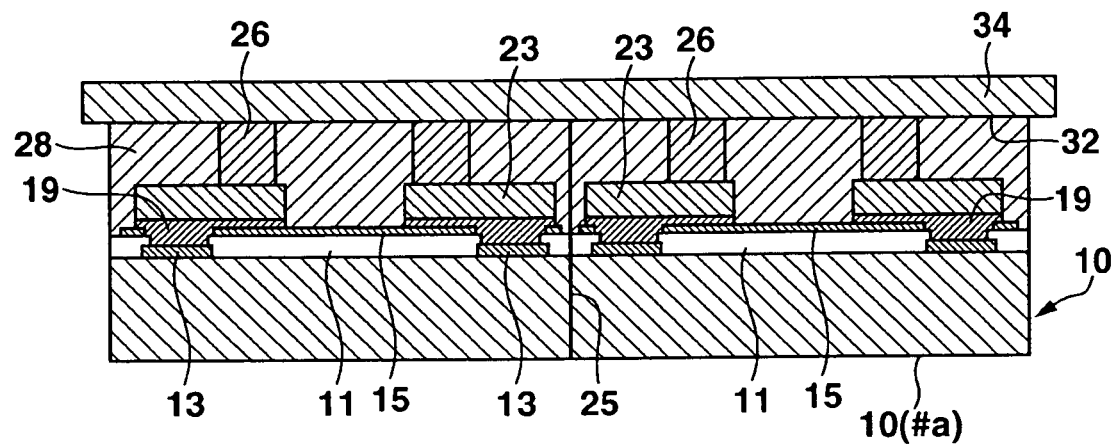
FIG. 19 is a longitudinal sectional view showing an example of the semiconductor device according to the first embodiment in a step of the method of manufacturing the semiconductor device (protective tape bonding)
Figure 20:
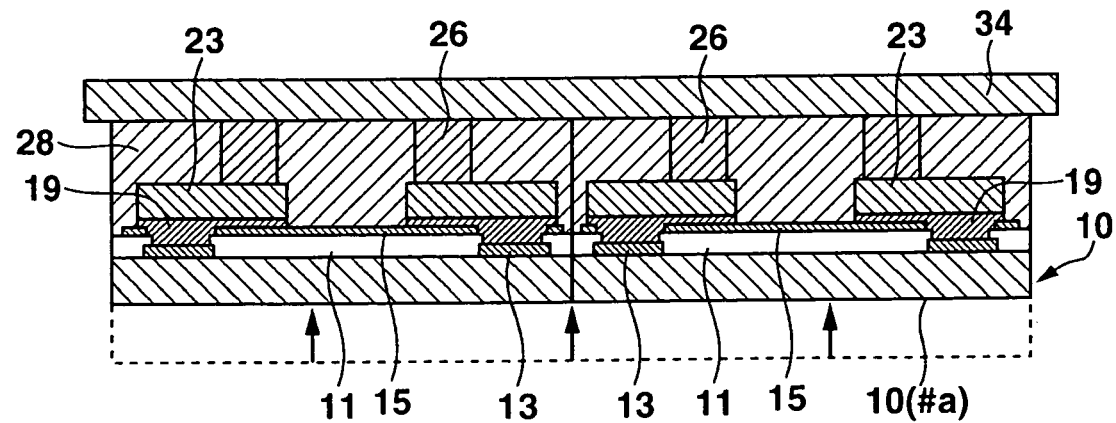
FIG. 20 is a longitudinal sectional view showing an example of the semiconductor device according to the first embodiment in a step of the method of manufacturing the semiconductor device (lower surface polishing)

As shown in FIG. 19, a surface protective tape 34 is bonded onto a polished surface 32 by heating and pressing to prevent contamination and damage to the surface. The lower surface 10 (#a) of the wafer 10 is polished by CMP (Chemical Mechanical Polishing) to decrease the wafer thickness from 600 to 750 µm in the initial state to 500 to 400 µm. By this lower surface polishing, a mirror surface is formed on the lower surface 10 (#a) of the wafer 10, as shown in FIG. 20. In addition, the thickness of the semiconductor device before formation of the external connection terminals is decreased to about 500 µm. This surface polishing step is essential to finally suppress the total thickness of the semiconductor device to 800 µm or less.

Figure 21:
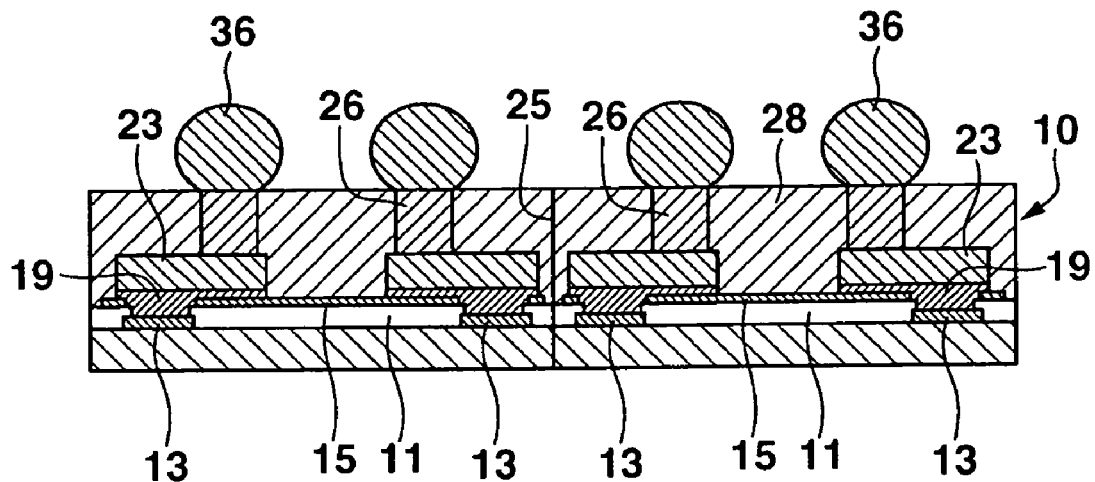
FIG. 21 is a longitudinal sectional view showing an example of the semiconductor device according to the first embodiment in a step of the method of manufacturing the semiconductor device (external connection terminal formation)

As shown in FIG. 21, solder balls are formed or a solder paste is printed on the exposed post electrodes 26 to supply a conductive material to form external connection terminals. The resultant structure is heated to temporarily melt the solder. External connection terminals 36 having a projection shape are formed by the surface tension of the molten solder. In this example, the external connection terminals 36 are made of solder. However, the present invention is not limited to this, and any other material or structure can be used as long as it has conductivity.

Figure 22:
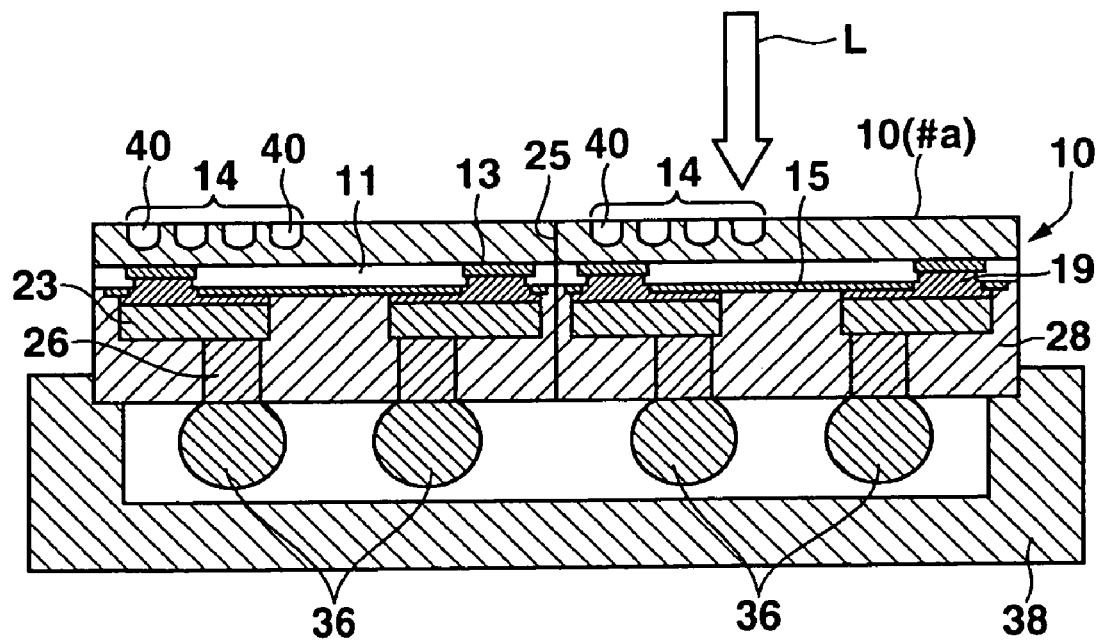
FIG. 22 is a longitudinal sectional view showing an example of the semiconductor device according to the first embodiment in a step of the method of manufacturing the semiconductor device (marking)

As shown in FIG. 22, after the external connection terminals 36 are formed, the wafer 10 is placed on a dedicated jig 38 while making the external connection terminals 36 face down and the wafer lower surface 10 (#a) face up in FIG. 22. The wafer 10 is fixed on the jig 38 and set in a laser marking apparatus (not shown). Predetermined information or mark is formed at a predetermined position on a predetermined semiconductor device on the basis of a preset program by using a laser marking apparatus (e.g., WH-4100 available from GSI Lumonics Inc.) and setting the printing speed to 500 to 1,000 mm/sec and a pulse rate to 5 to 15 kHz for the second harmonic of a YAG laser beam L. For example, when the printing speed is set to 1,000 mm/sec, and the pulse rate is set to 10 kHz, craters 40 (to be described later) can be formed at a pitch of 100 µm. A product information mark, index or test mark, and contrast adjusting mark, which are made of the plurality of craters 40, are formed.

Figure 23:
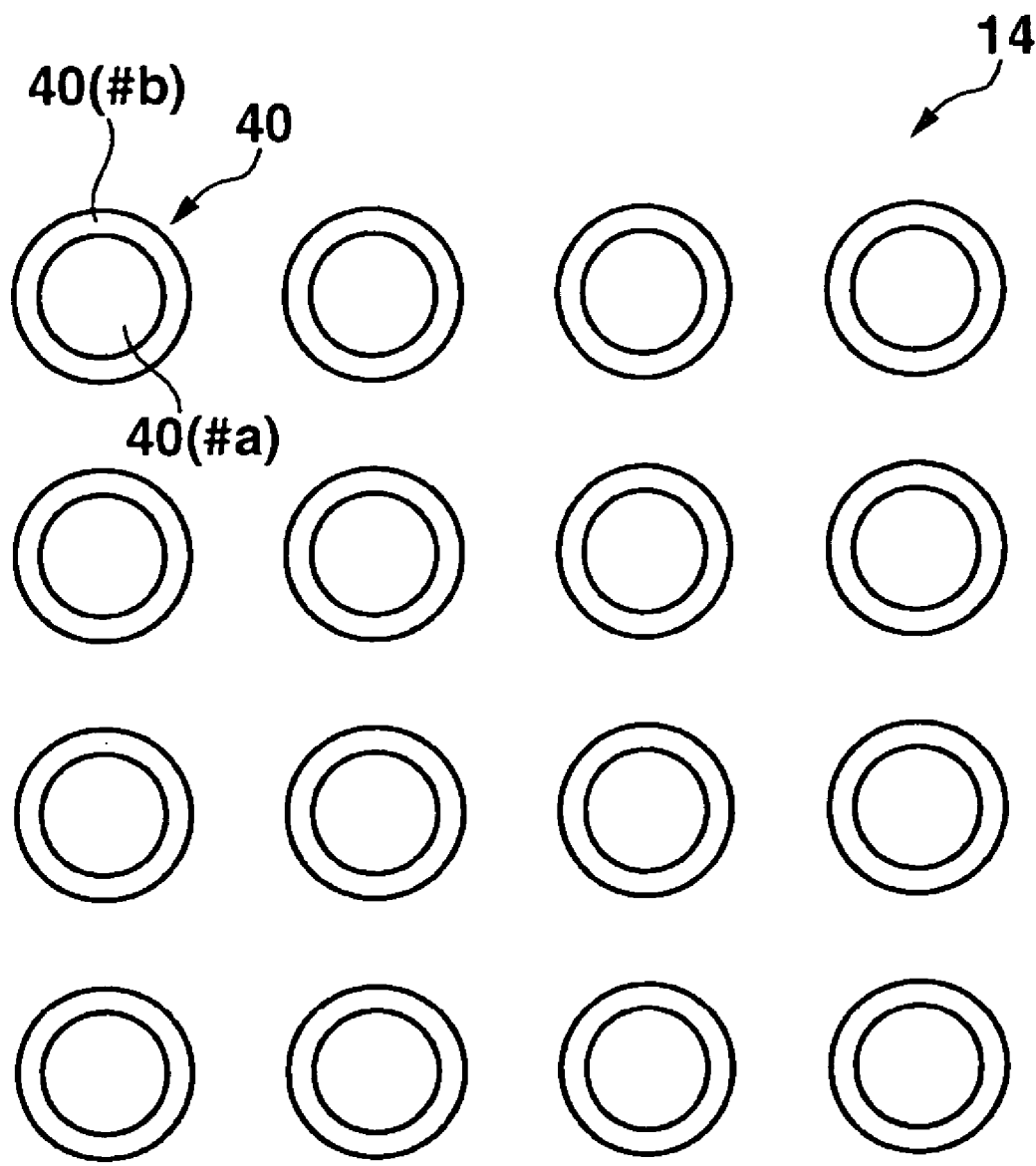
FIG. 23 is an enlarged plan view showing an example of a roughened region.

Formation of the craters 40 will be described next in detail. FIG. 23 is an enlarged plan view showing the roughened region 14 where the plurality of craters 40 are formed. As shown in FIG. 23, the marks 14 (#a, #b, and #c) are formed by almost periodically arraying a number of craters 40 formed by irradiating the lower surface 10 (#a) of the wafer 10 with laser.

Figure 24:
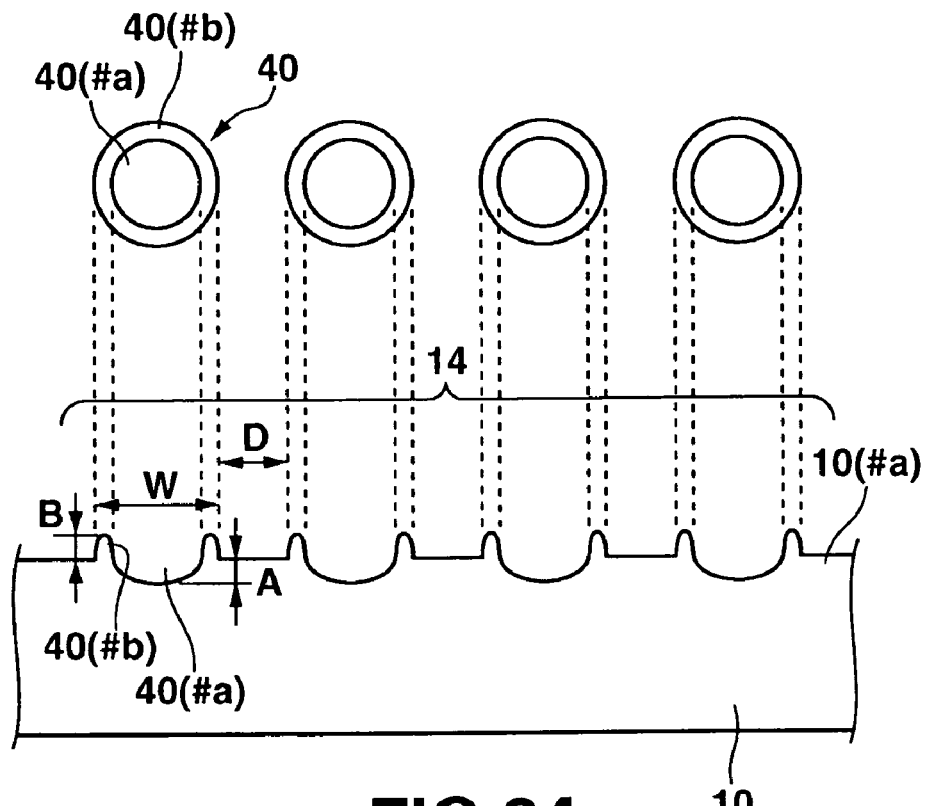
FIG. 24 shows a plan view of craters formed in a line and a sectional view corresponding to the plan view.

FIG. 24 shows a plan view of the craters 40 formed in a line and a sectional view corresponding to the plan view. Each crater 40 includes a recessed portion 40 (#a) formed by melting the lower surface 10 (#a) by laser irradiation and a projecting portion 40 (#b) formed when the melting mar builds up around the recessed portion 40 (#a). Each crater 40 has an almost circular shape on the lower surface 10 (#a). Typically, a depth A of the recessed portion 40 (#a) in the lower surface 10 (#a) is about 2 µm. A height B of the projecting portion 40 (#b) on the lower surface 10 (#a) is about 2 µm. A diameter W, i.e., the maximum width of the crater 40 along the lower surface 10 (#a) is about 50 µm.

A surface roughness (A+B) corresponding to the sum of the depth A of the recessed portion 40 (#a) and the height B of the projecting portion 40 (#b) largely affects the contrast of the lower surface 10 (#a). At a surface roughness of 1 µm or more, when the lower surface 10 (#a) is irradiated with light, diffuse reflection is promoted, and the contrast of the lower surface 10 (#a) is sufficiently suppressed. However, when the value of the surface roughness becomes large, a dicing tape 20 is welded to the recessed portion 40 (#a) and gradually becomes difficult to remove. From the viewpoint of the removability of the dicing tape 20, the surface roughness is preferably 10 µm. In consideration of the above point, in this embodiment, the surface roughness is set to 1 to 10 µm and, more preferably, about 5 µm.

Referring to FIGS. 23 and 24, adjacent craters 40 do not overlap. In this case, a mirror surface is formed between the craters 40.

Figure 25:
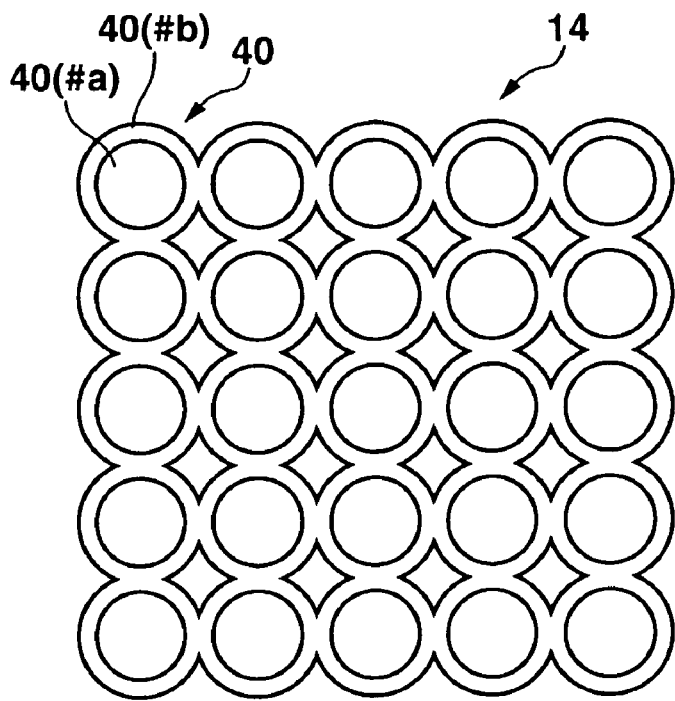
FIG. 25 is an enlarged plan view showing another example of the roughened region.

FIG. 25 is an enlarged plan view showing another example of the roughened region 14. Referring to FIG. 25, adjacent craters 40 overlap. To promote diffuse reflection and lower the contrast upon light irradiation on the lower surface 10 (#a), as many craters 40 as possible are formed in the roughened region 14. Hence, this layout can be employed. However, to form craters 40 at such a high density, the number of laser irradiation points increases. Hence, formation of the roughened region 14 is time-consuming. The craters 40 are preferably formed at a density sufficient to obtain a minimum necessary diffuse reflection effect. In consideration of the above point, in this embodiment, a separation distance D along the lower surface 10 (#a) between the adjacent craters 40 is set to be equal to or smaller than the diameter W, i.e., the maximum width of the crater 40 and, more preferably, equal to or smaller than ½ the maximum width, as shown in FIG. 24.

With the roughened region 14, the contrast of the lower surface 10 (#a) is decreased. Accordingly, an optical test apparatus (not shown) can recognize product information from the product information mark 14 (#a) or the index or test mark 14 (#b or #c) by irradiating the lower surface 10 (#a) with light.

Figure 26:
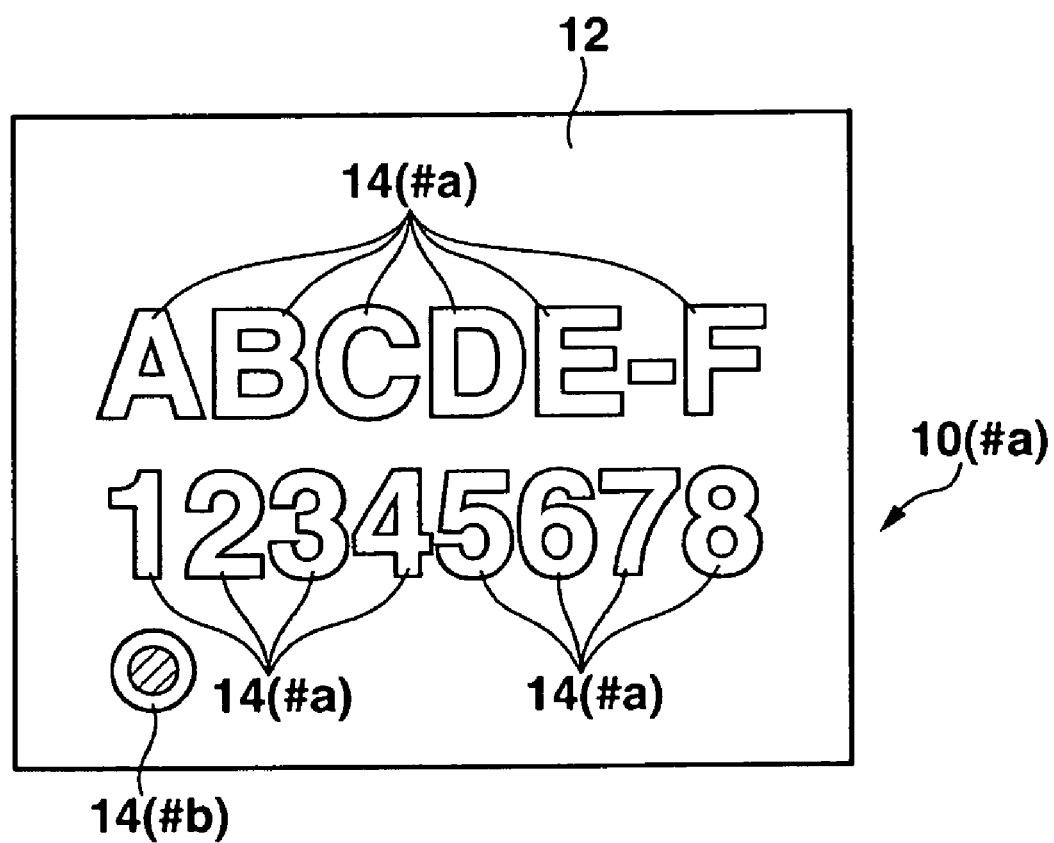
FIG. 26 is a plan view showing another example of the lower surface of the semiconductor device according to the first embodiment.

The number, size, shape, and layout position of the roughened regions 14 to be formed on the lower surface 10 (#a) are not particularly limited when the optical test apparatus can recognize product information from the product information mark 14 (#a) or recognize the index or test mark 14 (#b or #c). When the contrast on the lower surface 10 (#a) can sufficiently be reduced by making the product information mark 14 (#a) large, as shown in FIG. 26, the contrast adjusting mark 14 (#c) may be omitted.

As shown in FIGS. 23 and 24, the recessed portions 40 (#a) and the projecting portions 40 (#b) around them are formed by irradiating the wafer lower surface 10 (#a) with laser. In addition, craters 40 having a surface roughness of 1 to 10 μm can be formed such that adjacent craters 40 do not overlap.

With the roughened region 14 formed by thus forming the craters 40, the dicing tape 20 can easily and reliably be removed. In addition, the dicing tape 20 can be removed without leaving, as a residue, the acrylic resin adhesive on the projecting portions 40 (#b) formed around the recessed portions 40 (#a).

Figure 27:
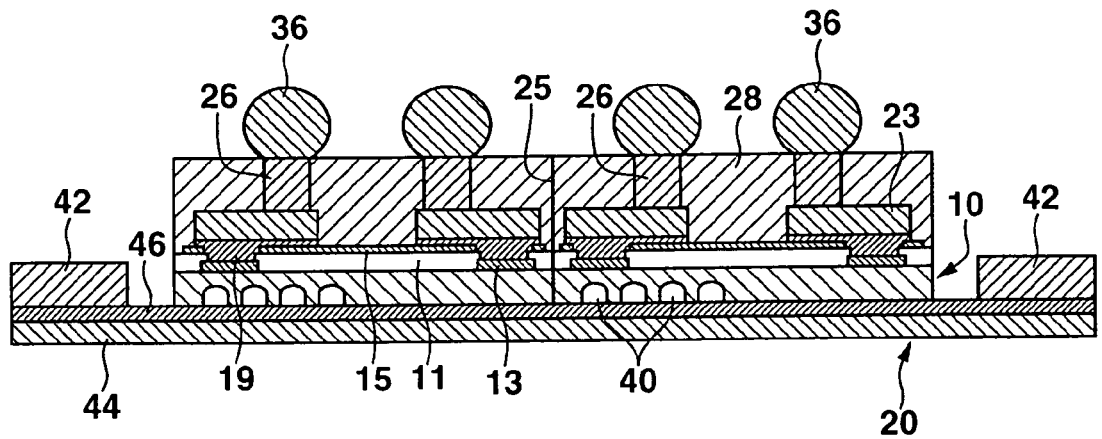
FIG. 27 is a longitudinal sectional view showing an example of the semiconductor device according to the first embodiment in a step of the method of manufacturing the semiconductor device (dicing tape bonding)
Figure 28:
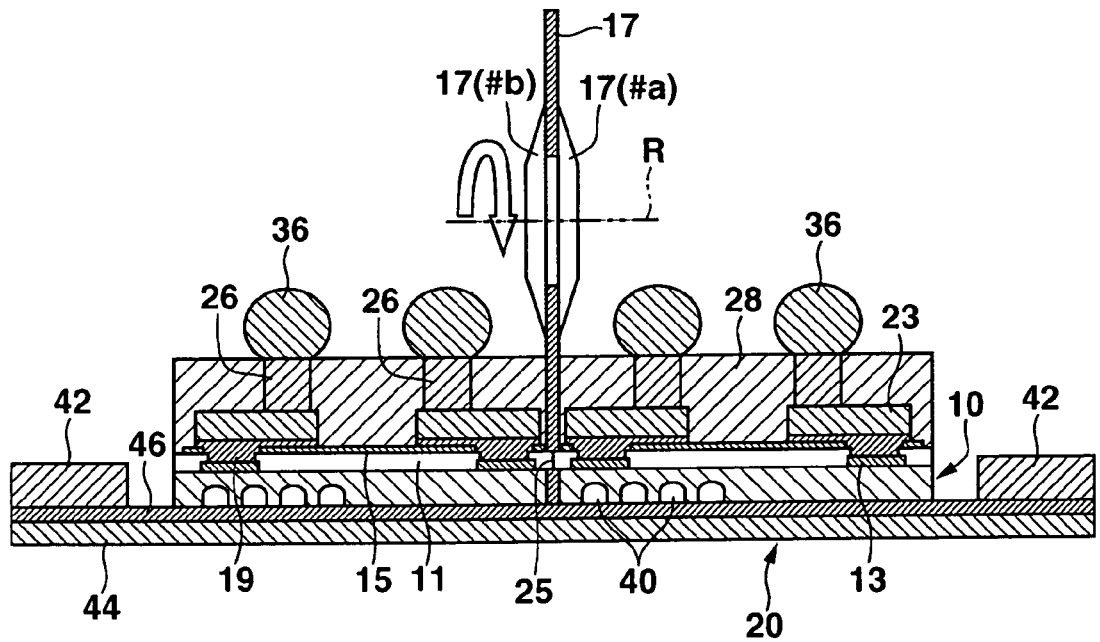
FIG. 28 is a longitudinal sectional view showing an example of the semiconductor device according to the first embodiment in a step of the method of manufacturing the semiconductor device (semiconductor wafer dicing)
Figure 29:
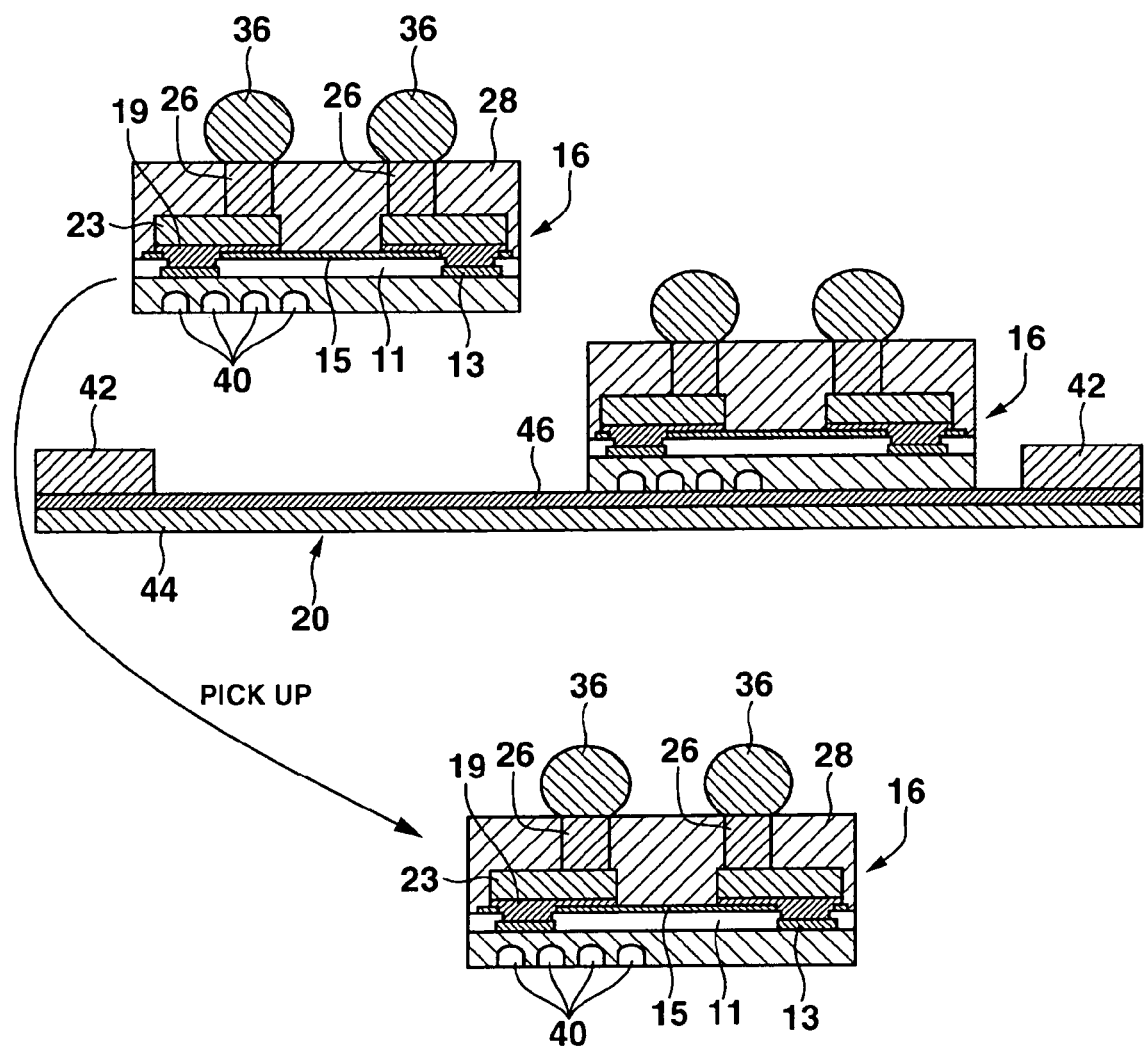
FIG. 29 is a longitudinal sectional view showing an example of the semiconductor device according to the first embodiment in a step of the method of manufacturing the semiconductor device (pickup of each semiconductor device)

Next, as shown in FIG. 27, to split the wafer 10 along the split lines 25, the dicing tape 20 and the wafer lower surface 10 (#a) having the marks 14 (#a, #b, and #c) are bonded to each other by heating and pressing. The dicing tape 20 is made by forming an acrylic-resin-based adhesive layer 46 on a base film 44 formed from a vinyl chloride resin bonded and fixed to a dicing ring 42 in advance. The wafer 10 in this state is set in a dicing apparatus. A known dicing blade 17 having a housing 17 (#a) and housing 17 (#b) is rotated about a rotating shaft R, as shown in FIG. 28. With this process, the wafer 10 is cut in a matrix shape. After that, the adhesive force of the acrylic resin is weakened by irradiating the resultant structure with rays from the side of the dicing tape 20. Then, the split semiconductor devices 16 are picked up, as shown in FIG. 29.

In the above process, pickup is performed after dicing. Instead, after dicing is executed by using an already known expand method, the semiconductor devices 16 may be further separated by radially expanding the dicing tape 20.

Figure 30:
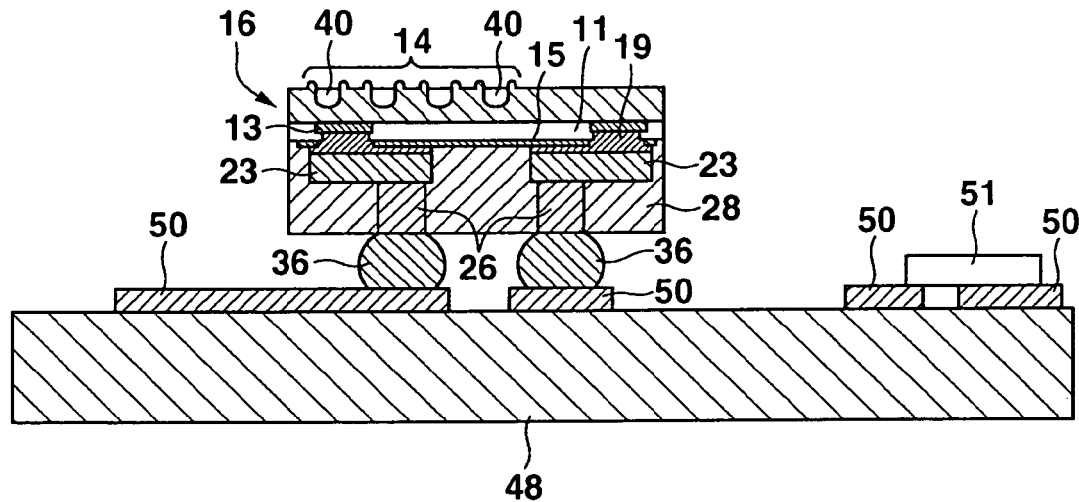
FIG. 30 is a longitudinal sectional view showing an example of the packaging structure of the semiconductor device according to the first embodiment.

FIG. 30 shows the packaging structure of the semiconductor device 16 having the above-described marks. The semiconductor device 16 is soldered, via the external connection terminals 36, to a predetermined position of a circuit interconnection 50 formed on a substrate 48. The circuit interconnection 50 on the substrate 48 may have another electronic component 51 different from the semiconductor device 16. The above-described marks 14 (#a, #b, and #c) are made of the recessed portions 40 (#a) and projecting portions 40 (#b) around the recessed portions 40 (#a), which are formed by laser irradiation. In addition, the marks also include the plurality of craters 40 having a surface roughness of 1 to 10 μm. Hence, even when the packaged semiconductor device 16 is tested by an optical test apparatus, the marks can accurately be recognized.

The function of the semiconductor device according to this embodiment having the above arrangement will be described next.

In the semiconductor device 16 according to this embodiment, the lower surface 10 (#a) is mirror-finished by a grinder or the like. After that, the roughened region 14 roughened by laser marking is formed at part of the lower surface. In the roughened region 14, marks such as the product information mark 14 (#a), index or test mark 14 (#b), and contrast adjusting mark 14 (#c) of the semiconductor device 16 are formed. These marks are formed by almost periodically arraying a number of craters 40 formed by irradiating the lower surface 10 (#a) with laser.

The surface roughness of the craters 40 greatly affects the contrast of the lower surface 10 (#a). At a surface roughness of 1 μm or more, when the lower surface 10 (#a) is irradiated with light, diffuse reflection is promoted, and the contrast of the lower surface 10 (#a) is sufficiently reduced. On the other hand, when the value of the surface roughness becomes large, the dicing tape 20 welds to the recessed portions 40 (#a) and gradually becomes difficult to remove. From the viewpoint of the removability of the dicing tape 20, the surface roughness is preferably 10 μm.

In this embodiment, the surface roughness of the craters 40 is set to 1 to 10 μm and, preferably, about 5 μm. Hence, when the lower surface 10 (#a) is irradiated with light, diffuse reflection is promoted, and the contrast of the lower surface 10 (#a) is sufficiently reduced. In addition, the dicing tape 20 can also easily be removed.

From the viewpoint of decreasing the contrast of the lower surface 10 (#a), the number density of the craters 40 in the roughened region 14 is preferably as high as possible. However, to form craters 40 at a high density, the number of laser irradiation points increases. Hence, formation of the roughened region 14 is time-consuming. In this embodiment, however, the separation distance D along the lower surface 10 (#a) between the adjacent craters 40 is set to be equal to or smaller than the diameter, i.e., the maximum width of the crater 40 and, more preferably, equal to or smaller than ½ the maximum width. Hence the minimum necessary diffuse reflection effect can be implemented, and the time required for formation of the roughened region 14 by laser marking can be shortened.

As described above, in the semiconductor device 16 according to this embodiment, when the roughened region 14 is formed, the contrast of the lower surface 10 (#a) decreases, as described above. For this reason, when the lower surface 10 (#a) is irradiated with light by an optical test apparatus, the product information can accurately be recognized from the product information mark 14 (#a). In addition, the index or test mark 14 (#b) can also accurately be recognized. Accordingly, the efficiency of the test executed by the optical test apparatus can be increased.

The number, size, shape, and layout position of the roughened regions 14 to be formed on the lower surface 10 (#a) are not particularly limited when the optical test apparatus can recognize product information from the product information mark 14 (#a) or recognize the index or test mark 14 (#b). When the contrast on the lower surface 10 (#a) can sufficiently be reduced by making the product information mark 14 (#a) large, as shown in FIG. 26, the contrast adjusting mark 14 (#c) may be omitted. In this way, the marks can flexibly be formed with few constraints.

The craters 40 are formed in the roughened region 14 at a minimum necessary density. Hence, the time required for formation of the roughened region 14 by laser making can be shortened. The dicing tape 20 can also easily be removed. In this embodiment, an example of WLCSP (wafer level CSP) have been described. However, the present invention is not limited to this. A semiconductor device which has, between the surface of the substrate 48 and the external connection terminals 36, another semiconductor device such as an active element such as a GaAs device or a passive element such as a resistance, capacitance, or inductance buried may be used.

SECOND EMBODIMENT

Figure 31:
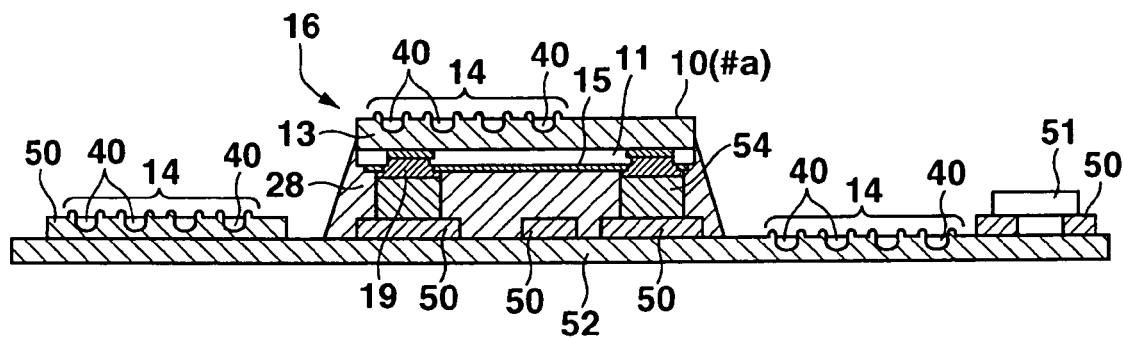
FIG. 31 is a longitudinal sectional view showing an example of the packaging structure of a semiconductor device according to the second embodiment.

FIG. 31 is a longitudinal sectional view showing the packaging structure of a semiconductor device 16 according to this embodiment.

In the packaging structure of the semiconductor device 16 according to this embodiment, a conductive member such as a Cu layer is formed on a flexible substrate 52 made of a plastic film of, e.g., epoxy, polyimide, polyetherimide (PET), or liquid crystal polymer (LCP) by casting, laminating, or sputter-plating. An etching resist is patterned, and the conductive member is etched to form a circuit interconnection 50. The semiconductor device 16 is bonded to the flexible substrate 52 through bump electrodes 54 by flip chip bonding. In the flexible substrate 52, the exposed region except connection pads (not shown) has a surface protective film made of, e.g., solder resist (not shown). The space formed by the flexible substrate 52 and semiconductor device 16 is filled with a sealing resin 28 such as epoxy resin by side potting.

Roughened regions 14 are formed not only on a wafer lower surface 10 (#a) but also on the plastic film which constructs the flexible substrate 52 and on the circuit inter-connection 50 which is connected to neither the semiconductor device 16 nor an electronic component 51. In addition, marks such as a product information mark 14 (#a) such as the lot number of the packaging structure, an index or test mark 14 (#b), and contrast adjusting mark 14 (#c), which are constituted by craters 40 described in the first embodiment, are formed.

As described above, the roughened regions 14 are formed not only on the wafer lower surface 10 (#a) but also on the flexible substrate 52. Accordingly, since the marks 14 (#a, #b, and #c) can be recognized by using a laser beam, high-speed processing can be performed. In addition, since the pieces of information are formed by the above-described marks, the information can be written in a small region.

The flexible substrate 52 made of plastic is semitransparent and has a high transmittance. In an optical recognition apparatus, light passes through the flexible substrate, and therefore, recognition is impossible. However, when the marks of the present invention are used, diffuse reflection of light occurs even when an optical recognition apparatus is used. Hence, a large amount of reflected light can be obtained. For this reason, the information written on the packaging structure can be read at a high speed. The marks may also be formed on a dummy interconnection formed for stable etching of the circuit inter-connection 50 or on a Cu surface which is left to reduce warping of the flexible substrate 52, i.e., a Cu surface which does not affect the characteristic and quality of the product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device which has a first surface on which an external connection electrode is formed and a second surface which opposes the first surface and is in a mirror surface state, the device comprising:

a first roughened region obtained by roughening a first part of the second surface by providing a first plurality of craters each including a first recessed portion and a first projecting portion around the first recessed portion by laser marking and forming one or more marks included in characters that include product information of a semiconductor device, the first plurality of craters being provided so that the distance along the second surface between adjacent first craters is no more than a maximum width of the first craters along the second surface, a second roughened region obtained by roughening a second part of the second surface by providing a second plurality of craters each including a second recessed portion and a second projecting portion around the second recessed portion by laser marking, the second plurality of craters being provided so that the distance along the second surface between adjacent second craters is no more than a maximum width of the second craters along the second surface, wherein the second roughened region has an adjusting function for adjusting a difference in light reflectance on the second surface by adjusting the number, size, shape and layout position of the second craters when the second surface is irradiated with light.

2. A device according to claim 1, wherein in each of the first plurality of craters, a difference between a bottom portion of the first recessed portion and a top portion of the first projecting portion is 1 to 10 µm.

3. A device according to claim 1 or 2, wherein adjacent first craters of the first plurality of craters do not overlap.

4. A device according to claim 1 or 2, wherein the product information includes an index mark of the semiconductor device itself, which is formed by laser marking.

5. A manufacturing method, wherein after a semiconductor device cluster including a plurality of semiconductor devices of claim 4 is prepared, the semiconductor device cluster is split into a predetermined size to manufacture the semiconductor device.

6. A device according to claim 1, wherein the number, size, shape, and layout position of the first plurality of craters are decided to make it possible to, when the second surface is irradiated with light, read the one or more marks formed on the first roughened region.

* * * * *